(12) United States Patent
Bacon

(10) Patent No.: US 11,171,631 B2
(45) Date of Patent: Nov. 9, 2021

(54) PROGRAMMABLE VOLTAGE VARIABLE ATTENUATOR

(71) Applicant: pSemi Corporation, San Diego, CA (US)

(72) Inventor: Peter Bacon, Derry, NH (US)

(73) Assignee: pSemi Corporation, San Diego, CA (US)

( * ) Notice: Subject to any disclaimer, the term of this patent is extended or adjusted under 35 U.S.C. 154(b) by 135 days.

(21) Appl. No.: 16/240,483

(22) Filed: Jan. 4, 2019

(65) Prior Publication Data

US 2019/0140624 A1 May 9, 2019

Related U.S. Application Data

(62) Division of application No. 15/291,984, filed on Oct. 12, 2016, now Pat. No. 10,236,863.

(51) Int. Cl.
*H03H 11/24* (2006.01)
(52) U.S. Cl.
CPC ................................. *H03H 11/245* (2013.01)
(58) Field of Classification Search
CPC ........... H03H 11/245; H03H 7/24; H03H 7/25
USPC .................................. 333/81 R; 327/308, 309
See application file for complete search history.

(56) References Cited

U.S. PATENT DOCUMENTS

| 8,614,597 B2 | 12/2013 | Zhang |
| 10,236,863 B2 | 3/2019 | Bacon |
| 2011/0140812 A1* | 6/2011 | Wu ...................... H03G 1/0088 333/81 R |
| 2018/0102764 A1 | 4/2018 | Bacon |

OTHER PUBLICATIONS

Jones, Stephen E., Office Action received from the USPTO dated May 10, 2018 for U.S. Appl. No. 15/291,984, 9 pgs.
Jones, Stephen E., Final Office Action received from the USPTO dated Sep. 18, 2018 for U.S. Appl. No. 15/291,984, 12 pgs.
Jones, Stephen E., Final Office Action received from the USPTO dated Nov. 20, 2018 for U.S. Appl. No. 15/291,984, 6 pgs.

(Continued)

*Primary Examiner* — Stephen E. Jones
(74) *Attorney, Agent, or Firm* — Jaquez Land Greenhaus & McFarland LLP; John Land, Esq.

(57) ABSTRACT

A programmable voltage variable attenuator (VVA) that enables selection among multiple analog, continuous attenuation ranges. Some embodiments include a dual-mode interface to enable digitally programming a DAC and provide the analog output to control the attenuation level of the VVA, or alternatively apply an externally provided analog voltage to directly control the VVA attenuation level. A VVA may be used in conjunction with a digital step attenuator (DSA). Some embodiments include circuitry for changing the VVA reference impedance. The attenuator architecture of the VVA includes one or more variable resistance shunt elements and/or series elements which may be a resistor and FET circuit controlled by a provided variable analog voltage. The multiple resistance element architecture may be implemented with stacked FET devices. Embodiments for the VVA may be based, for example, on T-type, Bridged-T type, Pi-type, L-pad type, reflection type, or balanced coupler type attenuators.

12 Claims, 9 Drawing Sheets

(56) References Cited

OTHER PUBLICATIONS

Jones, Stephen E., Notice of Allowance received from the USPTO dated Jan. 23, 2019 for U.S. Appl. No. 15/291,984, 6 pgs.
PSemi Corporation, Response filed in the USPTO dated Jun. 19, 2018 for U.S. Appl. No. 15/291,984, 11 pgs.
PSemi Corporation, Response filed in the USPTO dated Oct. 31, 2018 for U.S. Appl. No. 15/291,984, 12 pgs.
PSemi Corporation, Response filed in the USPTO dated Dec. 28, 2018 for U.S. Appl. No. 15/291,984, 10 pgs.

* cited by examiner

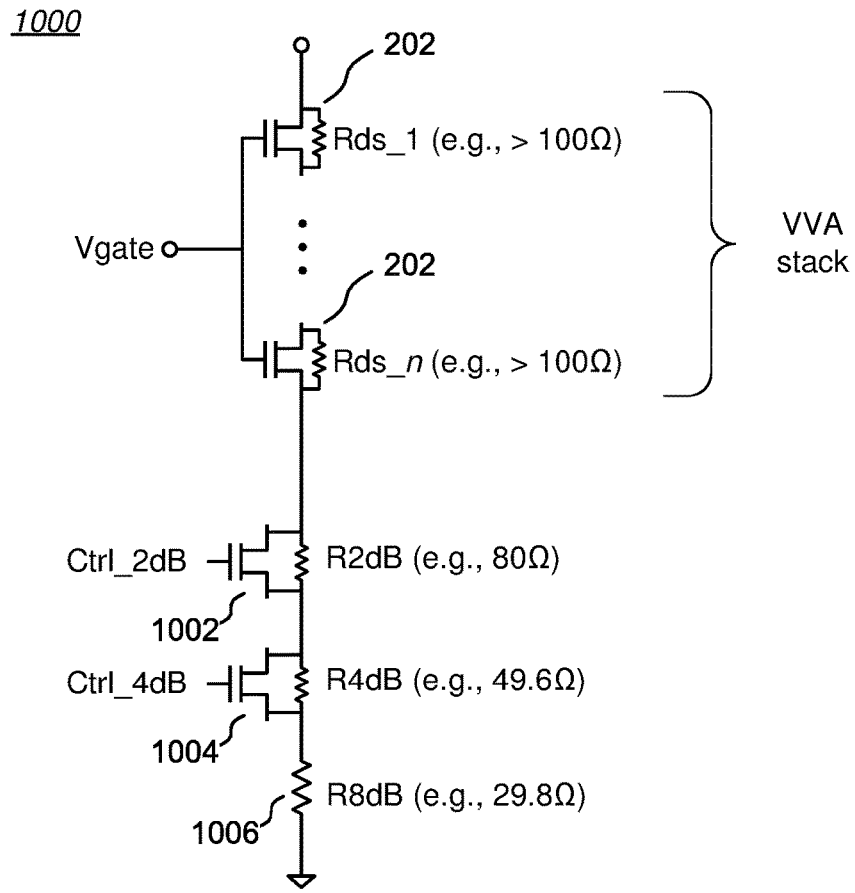
FIG. 10
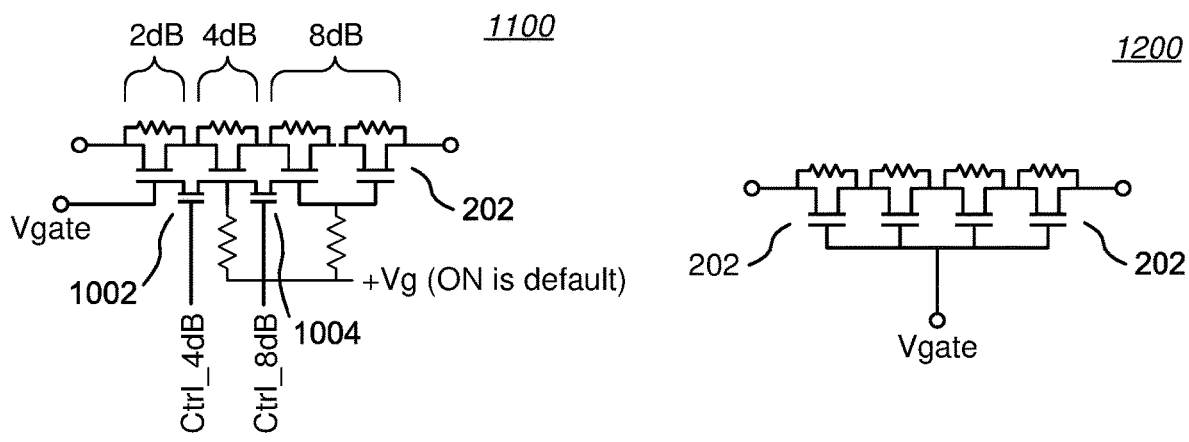
FIG. 11  FIG. 12

PROGRAMMABLE VOLTAGE VARIABLE ATTENUATOR

CROSS-REFERENCE TO RELATED APPLICATIONS—CLAIM OF PRIORITY

The present application is a divisional of, and claims priority to, and commonly assigned U.S. patent application Ser. No. 15/291,984, filed Oct. 12, 2016, entitled "Programmable Voltage Variable Attenuator", and the contents of said Ser. No. 15/291,984 application is incorporated herein by reference in its entirety.

BACKGROUND

(1) Technical Field

This invention relates to electronic circuits, and more particular to electronic attenuator circuits suitable for use with radio frequency signals.

(2) Background

An attenuator is an electronic device that reduces the power of a signal, and is frequently used in combination with other electronic circuitry to provide gain control, adjust power levels, provide compensation for variations in temperature, and/or improve impedance matching. When used to process radio frequency (RF) signals, ideally an attenuator reduces signal power without appreciably distorting the signal waveform. For RF applications, attenuators typically comprise a small network of passive (and, optionally, active) devices. Classic examples of single-valued RF attenuators are two-port Bridged-T type, Pi-type, T-type, and L-pad type attenuators.

Multiple single-valued RF attenuators of various types may be connected to provide for a selectable amount of attenuation in a circuit. Sometimes known as a digital step attenuators (DSAs), such attenuators are frequently used with RF systems such as transceivers for broadcast radio, cellular telephones, RF-based data networks (e.g., WiFi, Bluetooth), and RF test instruments. A conventional DSA consists of a series cascade of switchable single-valued RF attenuator cells, with binary weighted attenuation values; a more advanced type of DSA includes both binary and thermometer weighted attenuator cells. A switchable attenuator cell is designed to have two selectable states: (1) an attenuation state, and (2) a bypass or "through" state. The bypass state is normally provided by a switch connected in parallel with the input and output ports of an attenuator network (e.g., two-port Bridged-T type, Pi-type, T-type, and L-pad type attenuators). The switch is typically a field effect transistor (FET), and is commonly a MOSFET.

To control signal levels in an RF channel, attenuators are commonly used to change the RF signal amplitude level to more optimum levels. In communication links with complex modulation, such as quadrature amplitude modulation (QAM), this can be problematic if the change in signal level is abrupt and the change is comparable to the inter-symbol spacing. Accordingly, as the QAM level increases, the system's sensitivity to fast and discontinuous amplitude changes also increases.

DSAs, particularly those having a binary weighted bit architecture, are challenging to use in an RF environment because of the distinct steps in the attenuation behavior. Even if the step size of a DSA is kept below the Error Vector Magnitude (EVM) sensitivity level, the total transition to reach a minutely different attenuation state may require the toggling of numerous distinct control bits—and thus associated attenuator cells—causing significant disruption in the actual signal level. Thermometer coded DSAs help with keeping the transition behavior under control, but the fundamental change in amplitude for each step size is still significant, and although the transition time is fairly fast, the change does cause a discontinuity in the signal level that can introduce errors.

To eliminate the step-size problems of DSAs, analog attenuators known as voltage variable attenuators (VVAs) have been used to provide a continuous range of attenuation. One way to implement an analog, continuous range VVA is with a voltage-controlled resistive device; diodes and FETs are common 2-port and 3-port devices used for this role. However, a problem with implementing an integrated VVA is determining the financial or economic return that is possible with a specific attenuation range. VVAs used in control loops often require more the 4 dB of range to work with—some VVAs require as much as 30 dB of range. Small attenuation ranges provide greater accuracy with a smaller $\Delta dB/\Delta Vctrl$ ratio (Vctrl being a control voltage), due to ease of calibration, signal alignment, and signal cancellation, but larger attenuation ranges provide greater control with larger $\Delta dB/\Delta Vctrl$, e.g., a wide gain control range for more dynamic environments.

Accordingly, there is a need for an improved attenuator that enables selection among multiple analog, continuous attenuation ranges. The present invention addresses this need and provides additional advantages.

SUMMARY OF THE INVENTION

The invention encompasses an improved programmable voltage variable attenuator (VVA) that enables selection among multiple analog, continuous attenuation ranges.

In some embodiments, a dual-mode interface has the ability to digitally program a multiple bit digital-to-analog converter (DAC) and provide the analog output of the DAC to control the attenuation level of the VVA, or alternatively apply an externally provided analog voltage to directly control the attenuation level of the VVA. The dual-mode interface allows a single part to be used in systems having different control signal interfaces. In some embodiments, a VVA may be used in conjunction with a digital step attenuator (DSA) to provide for a greater range of attenuation levels through the DSA, while using the VVA to provide fine, step-less attenuation adjustments. Some embodiments may include circuitry for changing the reference impedance of the VVA so that a single part can be used in systems with a different characteristic impedance Zo.

The attenuator architecture of the VVA includes one or more variable resistance shunt elements and/or variable resistance series elements. A variable resistance element, in either case, may be a resistor R coupled in parallel with a field effect transistor (FET) controlled by a provided variable analog voltage applied to the gate of the FET, or may be a resistor R coupled in series with a FET controlled by a provided variable analog voltage applied to the gate of the FET. In particular embodiments disclosed below, the shunt element is series connected (i.e., R+FET) while the series element is parallel connected (i.e., R||FET). In one illustrated embodiment, the architecture of the VVA is based on a T-type attenuator configuration, with multiple variable resistance shunt elements and/or variable resistance series elements that are either included or excluded from being controlled by the variable analog voltage applied to the variable resistance elements of the VVA. The multiple resistance element architecture may be implemented with stacked FET devices, and thus meet high power and high voltage requirements while facilitating a programmable attenuation range. Alternative architectures for the VVA may be based on Bridged-T type, Pi-type, L-pad type, reflection type, or balanced coupler type attenuators.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 10 is a schematic diagram of a second embodiment of a shunt resistance circuit including multiple variable and selectable resistance elements.

FIG. 11 is a schematic diagram of a first embodiment of a series resistance circuit including multiple variable and selectable resistance elements.

FIG. 12 is a schematic diagram of a second embodiment of a series resistance circuit including multiple variable and selectable resistance elements.

Like reference numbers and designations in the various drawings indicate like elements.

DETAILED DESCRIPTION OF THE INVENTION

Figure 1:
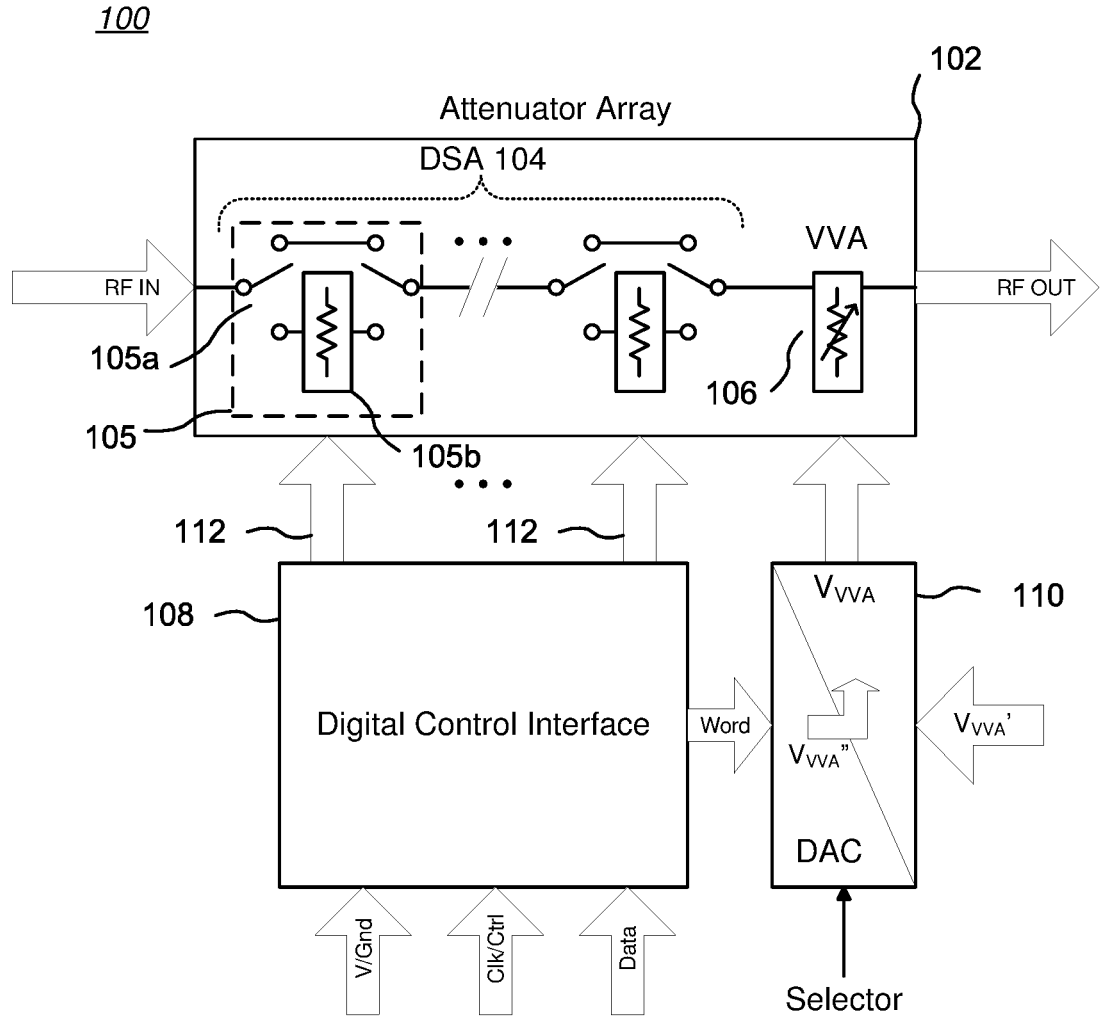
FIG. 1 is block diagram of a programmable attenuator in accordance with the present invention.

The invention encompasses an improved programmable voltage variable attenuator (VVA) that provides an analog, continuous attenuation range.

In some embodiments, a dual-mode interface has the ability to digitally program a multiple bit (e.g., 10 bit) digital-to-analog converter (DAC) and provide the analog output of the DAC to control the attenuation level of the VVA, or alternatively apply an externally provided analog voltage to directly control the attenuation level of the VVA. In various embodiments, the selection of the interface mode can be made through a variety of means, such as a board level pin assignment change, a bonding diagram change, or a programming option within an integrated serial peripheral interface. The dual-mode interface allows a single part to be used in systems having different control signal interfaces.

In some embodiments, a VVA may be used in conjunction with a digital step attenuator (DSA) to provide for a greater range of attenuation levels through the DSA, while using the VVA to provide fine, step-less attenuation adjustments. Some embodiments may include circuitry for changing the reference impedance of the VVA so that a single part can be used in systems with a different characteristic impedance Zo.

The attenuator architecture of the VVA includes one or more variable resistance shunt elements and/or variable resistance series elements. A variable resistance element, in either case, may be a resistor R coupled in parallel with a field effect transistor (FET) controlled by a provided variable analog voltage applied to the gate of the FET, or may be a resistor R coupled in series with a FET controlled by a provided variable analog voltage applied to the gate of the FET. In particular embodiments disclosed below, the shunt element is series connected (i.e., R+FET) while the series element is parallel connected (i.e., R∥FET). The FET is operated over its linear region to provide a variable degree of conduction from source to drain in response to a control voltage applied to its gate, thereby regulating the amount of total resistance presented by the FET-resistor combination. In some embodiments, a diode may be used in place of the FET, in which case it is the level of device current that sets the resistance, and this in turn is controlled by changing the voltage applied across the diode.

In one illustrated embodiment, the architecture of the VVA is based on a T-type attenuator configuration, with multiple variable resistance shunt elements and/or variable resistance series elements that are either included or excluded from being controlled by the variable analog voltage applied to the variable resistance elements of the VVA. The multiple resistance element architecture may be implemented with stacked FET devices, and thus meet high power and high voltage requirements while facilitating a programmable attenuation range. Alternative architectures for the VVA may be based on Bridged-T type, Pi-type, L-pad type, reflection type, or balanced coupler type attenuators.

Switched Attenuator Array

FIG. 1 is block diagram of a programmable attenuator 100 in accordance with the present invention. The programmable attenuator 100 includes an attenuator array 102 comprising a DSA 104 series connected to a VVA cell 106 (as should be clear, the order of the DSA 104 and the VVA cell 106 may be reversed, or the VVA cell 106 may be interspersed within the cells of the DSA 104). The attenuator array 102 is configured to receive an RF IN signal and attenuate that signal by a programmable amount within the range of the attenuator array 102 to generate an RF OUT signal.

As described above, the DSA 104 comprises one or more attenuator cells 105 each including a state switch 105a and an attenuator circuit 105b (only one cell is labeled to avoid clutter). The state switch 105a is controllable to bypass the associated attenuator circuit 105b or engage (i.e., serially connect) the associated attenuator circuit 105b to the signal path from RF IN to RF OUT. The attenuator circuit 105b is of a type suitable for attenuating RF signals, such as a Bridged-T type, Pi-type, T-type, L-pad type, reflection type, or balanced coupler type attenuator. The DSA 104 cells may be binary and/or thermometer weighted to provide a selectable level of attenuation in discrete steps. The serially coupled VVA cell 106 provides a continuous range of fine, step-less attenuation adjustment controlled by an applied analog voltage, as described in greater detail below. Stated somewhat differently, each attenuation step level of the DSA 104 may be continuously varied to more optimally place the attenuation range of the VVA cell 106 with respect to the applied and desired signal levels. Thus, the VVA range can be centered about the desired Pout level by varying the DSA level.

Control for the attenuator array 102 is provided through a digital control interface 108 and a VVA controller 110. While shown as separate blocks, the digital control interface 108 and the VVA controller 110 may be integrated within a single block. The digital control interface 108 is generally a conventional design that has inputs for various voltages and circuit ground (V/Gnd), clock and control lines (Clk/Ctrl), and attenuation levels (Data). Control signals and attenuation levels may be provided through the well-known interfaces specified by the MIPI (Mobile Industry Processor Interface) Alliance, or through the well-known Serial Peripheral Interface (SPI) bus, or by direct signal pins, or by any other convenient means. A desired level of attenuation is provided from a source external to the digital control interface 108 and converted to suitable switch control lines 112 to set the state switch 105a of each attenuator cell 105 to either bypass or engage the associated attenuator circuit 105b.

The added VVA controller 110 is configured to have two operational modes, selectable by a Selector signal, which may be provided from a source external to the VVA controller 110 or through the digital control interface 108. In a direct analog control mode, the VVA controller 110 conveys a supplied analog voltage $V_{VVA}'$ from a source external to the VVA controller 110 as an attenuation level control voltage $V_{VVA}$ to the VVA cell 106. In a digital control mode, a digital-to-analog controller is engaged to convert a supplied digital attenuation level control Word to an analog voltage $V_{VVA}''$, which is then conveyed to the VVA cell 106 as the attenuation level control voltage $V_{VVA}$. The digital attenuation level control Word may be provided through the digital control interface 108 (as shown), or may be provided directly to the VVA controller 110 through other signal lines (not shown) from an external source. As should be clear to one of ordinary skill in the art, internal to the VVA controller 110 is a switch (not shown), controlled by the Selector signal, that selects either an externally supplied analog voltage $V_{VVA}'$ or the converted analog voltage $V_{VVA}''$ from the DAC as the output $V_{VVA}$ of the VVA controller 110. In various embodiments, the selection of the operational mode by means of the Selector signal can be made through a variety of means, such as a board level pin assignment change, a bonding diagram change, a programming option within an integrated SPI, through the digital control interface 108, etc.

VVA Architecture

Figure 2A:
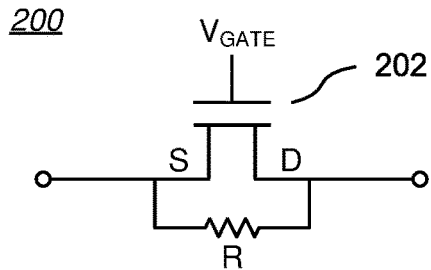
FIG. 2A is a schematic diagram of a variable parallel resistance element suitable for use in embodiments of the present invention.

The VVA cell 106 shown in FIG. 1 may be implemented with a variety of variable resistance elements using a variety of architectures. For example, FIG. 2A is a schematic diagram of a variable parallel resistance element 200 suitable for use in embodiments of the present invention. The example variable parallel resistance element 200 includes a resistor R coupled in parallel with the source S and drain D terminals of a field effect transistor (FET) 202 controlled by a provided variable analog voltage applied to the gate of the FET 202. The FET 202 is operated in its linear region to provide a variable degree of conduction from source S to drain D, thereby regulating the amount of total resistance presented by the parallel FET-resistor combination.

Figure 2B:
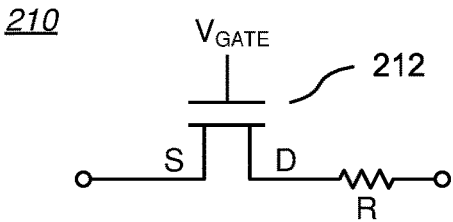
FIG. 2B is a schematic diagram of a variable series resistance element suitable for use in embodiments of the present invention.

Similarly, FIG. 2B is a schematic diagram of a variable series resistance element 210 suitable for use in embodiments of the present invention. The example variable series resistance element 210 includes a resistor R coupled in series with the source S and drain D terminals of a field effect transistor (FET) 212 controlled by a provided variable analog voltage applied to the gate of the FET 212. The FET 212 is operated in its linear region to provide a variable degree of conduction from source S to drain D, thereby regulating the amount of total resistance presented by the series FET-resistor combination.

As noted above, for RF applications, attenuators typically comprise a small network of passive (and, optionally, active) devices. In many applications, it is desirable to use a purely passive architecture. It is also desirable to use an architecture that maintains an acceptable Voltage Standing Wave Ratio (VSWR) on all RF ports, such as 1.5:1 or better, and 1:1 in the ideal case.

Figure 3:
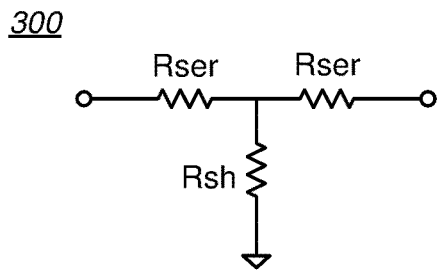
FIG. 3 is a schematic diagram of a T-type attenuator architecture suitable for use in embodiments of the present invention.

For example, FIG. 3 is a schematic diagram of a T-type attenuator architecture 300 suitable for use in embodiments of the present invention. A shunt resistance Rsh is coupled between circuit ground and a junction point between a pair of connected series resistances Rser. For a desired attenuation (loss) level Ads (expressed as a negative dB value), a value $A_{MAG}$ can be defined as:

$$A_{MAG} = 10^{(A_{dB}/20)}$$

For example, if $A_{dB} = -2$ dB, then $A_{MAG} = 0.794$.

For the T-type attenuator architecture 300, Rser and Rsh can be defined in terms of $A_{MAG}$ and the system characteristic impedance Zo as follows:

$$R_{SER} = Z_O \frac{1 - A_{MAG}}{1 + A_{MAG}}$$

$$R_{SH} = \frac{2 * Z_O * A_{MAG}}{1 - 10^{(A_{dB}/10)}}$$

As can be seen, both equations can be manipulated to define $A_{MAG}$—and thus a desired attenuation level $A_{dB}$—in terms of either Rsh or Rser for a particular system characteristic impedance Zo. Accordingly, while FIG. 3 schematically shows both Rsh and Rser with a fixed resistor symbol, either or both resistor components can be replaced by the variable parallel or series resistance element 200, 210 of the types shown in FIG. 2A and FIG. 2B, respectively, to create a VVA attenuator architecture for RF signals.

Figure 4:
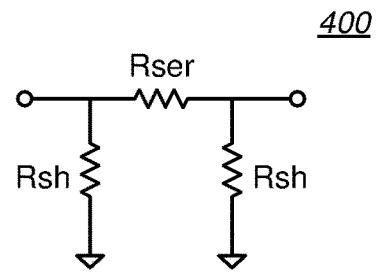
FIG. 4 is a schematic diagram of a Pi-type attenuator architecture suitable for use in embodiments of the present invention.

While the examples below use a T-type attenuator architecture 300 for purposes of illustration of various aspects of the invention, other attenuator architectures may be substituted to achieve similar results. For example, FIG. 4 is a schematic diagram of a Pi-type attenuator architecture 400 suitable for use in embodiments of the present invention. For this architecture, Rser and Rsh can be defined in terms of $A_{MAG}$ and the system characteristic impedance Zo as follows:

$$R_{SER} = \frac{Z_O}{2} * \frac{1 + 10^{(A_{dB}/10)}}{A_{MAG}}$$

$$R_{SH} = Z_O \frac{1 + A_{MAG}}{1 - A_{MAG}}$$

Figure 5:
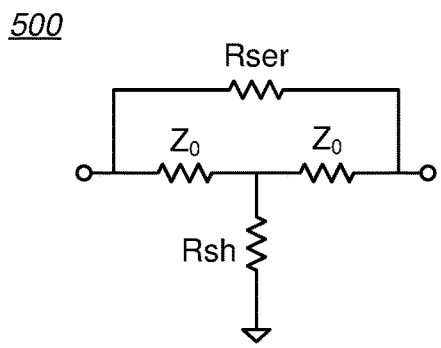
FIG. 5 is a schematic diagram of a Bridged-T type attenuator architecture suitable for use in embodiments of the present invention.

FIG. 5 is a schematic diagram of a Bridged-T type attenuator architecture 500 suitable for use in embodiments of the present invention. For this architecture, Rser and Rsh can be defined in terms of $A_{MAG}$ and the system characteristic impedance Zo as follows:

$$R_{SER} = Z_O * (1 - A_{MAG})$$

$$R_{SH} = \frac{Z_O}{(1 - A_{MAG})}$$

Figure 6:
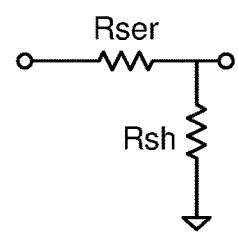
FIG. 6 is a schematic diagram of an L-pad type attenuator architecture suitable for use in embodiments of the present invention.

FIG. 6 is a schematic diagram of an L-pad type attenuator architecture 600 suitable for use in embodiments of the present invention. An L-pad type attenuator architecture is useful for matching the impedances of unbalanced source and load networks. For this architecture, Rser and Rsh can be defined in terms of $A_{MAG}$ and the system characteristic impedance Zo as follows:

$$R_{SH} = \frac{A_{MAG} * Z_O}{(1 - A_{MAG})}$$

$$R_{SER} = Z_O - (R_{SH} * Z_O)/(R_{SH} + Z_O))$$

Figure 7:
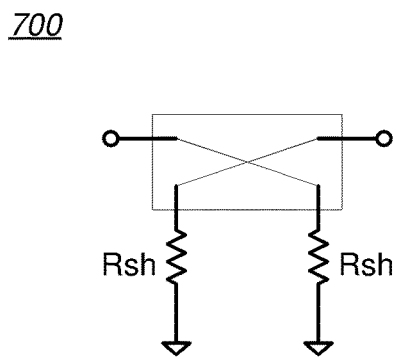
FIG. 7 is a schematic diagram of a reflection type attenuator architecture suitable for use in embodiments of the present invention.

FIG. 7 is a schematic diagram of a reflection type attenuator architecture 700 suitable for use in embodiments of the present invention. In this architecture, there is no series resistance Rser, only the shunt resistance Rsh. Rsh can be defined in terms of $A_{MAG}$ and the system characteristic impedance Zo as follows (note that there are two distinct solutions, depending on the value of Rsh compared to Zo):

$$R_{SH} = Z_O \frac{1 - A_{MAG}}{1 + A_{MAG}} \text{ for } R_{SH} < Z_O$$

$$R_{SH} = Z_O \frac{1 + A_{MAG}}{1 - A_{MAG}} \text{ for } R_{SH} > Z_O$$

Figure 8:
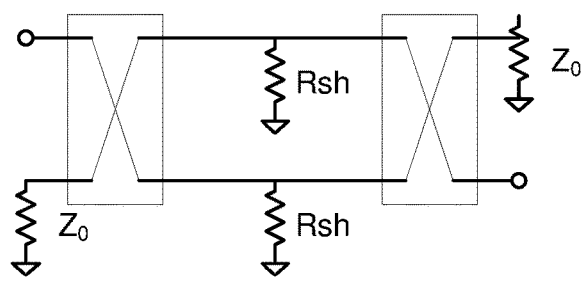
FIG. 8 is a schematic diagram of a balanced coupler type attenuator architecture suitable for use in embodiments of the present invention.

FIG. 8 is a schematic diagram of a balanced coupler type attenuator 800 architecture suitable for use in embodiments of the present invention. In this architecture, there is no series resistance Rser, only shunt resistances Rsh. Rsh can be defined in terms of $A_{MAG}$ and the system characteristic impedance Zo as follows:

$$R_{SH} = Z_O/(1 - A_{MAG})$$

Utilizing any of the attenuator architectures shown in FIGS. 3-8, a level of attenuation can be set by varying the resistance of at least the shunt resistance Rsh element. In those attenuator architectures that include a series resistance Rser element, the attenuation level also can be varied by varying the resistance Rsh. Accordingly, a VVA attenuator may be implemented by employing a single variable parallel or series resistance element 200, 210 of the types shown in FIG. 2A and FIG. 2B, respectively, as the shunt resistance Rsh element and/or as the series resistance Rser element. However, in many applications, other design factors and constraints need to be considered, such as power and/or voltage handling capacity and linearity. In addition, it would be useful in some applications to configure a single VVA attenuator to have multiple selectable attenuation ranges.

Accordingly, in one illustrated embodiment, a VVA attenuator is based on a particular attenuator architecture, and includes multiple variable resistance shunt elements and/or variable resistance series elements that are either included or excluded from being controlled by a variable analog voltage applied to the variable resistance elements. The multiple resistance element architecture may be implemented with stacked FET devices grouped in selectable segments, and thus meet high power and high voltage requirements while facilitating a programmable attenuation range.

Variable Shunt Resistance for VVA Architecture

In one embodiment of the invention, the architecture of a VVA circuit is based on a T-type attenuator configuration. As noted above, the shunt resistance Rsh element can be varied in order to change the attenuation level of a T-type attenuator VVA circuit. Two shunt resistance circuits are described below that are capable of withstanding high power and high voltages and provide a programmable attenuation range.

Figure 9:
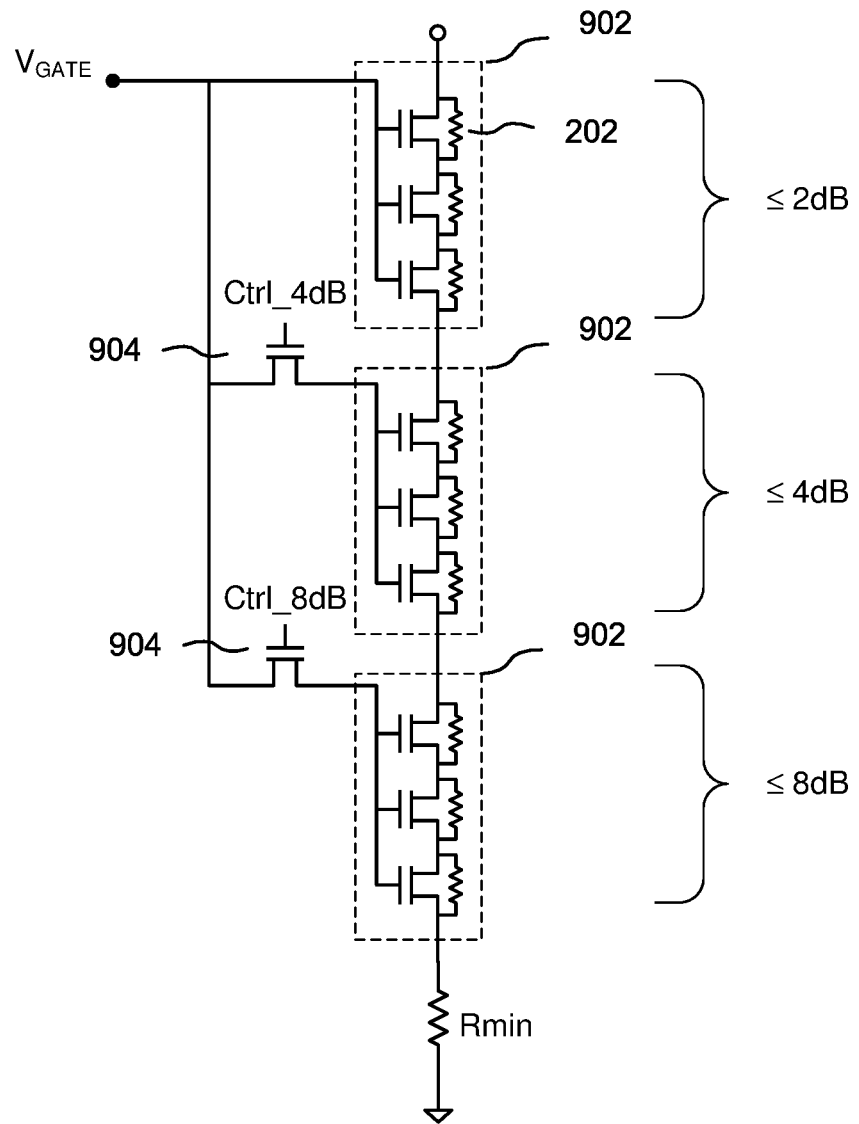
FIG. 9 is a schematic diagram of a first embodiment of a variable and selectable shunt resistance circuit.

FIG. 9 is a schematic diagram of a first embodiment of a variable and selectable shunt resistance circuit 900. The shunt resistance circuit 900 includes one or more segments 902 of variable resistance elements 202 of the type shown in FIG. 2A; three series-connected segments 902 are shown in the illustrated example (to avoid clutter, not all variable resistance elements 202 are labeled). Each segment 902 includes one or more variable resistance elements 202; three series-connected variable resistance elements 202 per segment are shown in the illustrated example. By providing multiple segments 902, multiple attenuation ranges may be selected under program control. Note that while the variable resistance elements 202 are shown grouped within corresponding segments 902, such elements could be interspersed and alternating to optimize linearity and voltage division. Note also that variable series resistance elements 212 of the type shown in FIG. 2B may be used as an alternative to the illustrated variable parallel resistance elements 202.

It is useful to provide more than one series-connected variable resistance element 202 per segment because "stacking" the FETs within such elements provides better voltage and power handling capability, and improved linearity. Linearity is directly related to the voltage applied per device, so by increasing stack height, the voltage per device decreases for a particular input power level, and thus the generation of non-linearities is reduced. Examples of FET stacking are shown in U.S. Pat. No. 7,248,120, issued Jul. 24, 2007, entitled "Stacked Transistor Method and Apparatus"; U.S.

Pat. No. 7,088,971, issued Aug. 8, 2006, entitled "Integrated RF Front End"; and U.S. Pat. No. 8,649,754, issued Feb. 11, 2014, entitled "Integrated RF Front End with Stacked Transistor Switch", and assigned to the assignee of the present invention, all of which are hereby incorporated by reference.

As a practical matter, the drain-to-source resistor across each FET of the lower two segments 902 should be carefully selected so that the resistor values, when summed in the series stack, still permits the top segment to impact the shunt resistance value.

Referring to the example circuit shown in FIG. 9, a control voltage, $V_{GATE}$ (derived from the provided $V_{VVA}$ voltage described above) is applied to the gates of the variable resistance elements 202 of a first (or "top") segment 902. The gates of the variable resistance elements 202 of the remaining segments 902 may be coupled to the control voltage $V_{GATE}$ if corresponding switches 904 are set to an ON (conducting) state by corresponding control signals Ctrl_4 dB and Ctrl_8 dB, thus operationally enabling or disabling such segments 902 to change the attenuation range of the shunt resistance circuit 900. The switches 904 are shown implemented as FETs, but may be implemented with other technologies (e.g., microelectromechanical system—MEMS—switches).

A final series-connected resistor Rmin is provided between circuit ground and the series-connected segments 902 to set a minimum resistance for the shunt resistance circuit 900. The value of Rmin for a particular shunt resistance circuit 900 in a particular T-type attenuator VVA circuit with known Rser values can be determined by setting the control signals Ctrl_4 dB and Ctrl_8 dB to an ON state and setting $V_{GATE}$ to turn the FETs of all of the variable resistance elements 202 to a fully conductive state so that each variable resistance element 202 has a resistance equal to the $R_{ON}$ value of its corresponding FET. Accordingly, $R_{SH}$=Ron*[stack_height_n]+Rmin, and $R_{SH}$ is set by Zo and Ads ($A_{MAG}$) as follows:

$$R_{SH} = Z_O \frac{1 + A_{MAG}}{1 - A_{MAG}}$$

With the illustrated configuration, when the control signals Ctrl_4 dB and Ctrl_8 dB are in an OFF state, each variable resistance element 202 in the corresponding segment 902 is at a maximum resistance since $V_{GATE}$ is blocked from being applied to the gate of the FET of those variable resistance elements 202. Accordingly, $V_{GATE}$ only varies the resistance of the variable resistance elements 202 in the first or top segment 902, which provides an attenuation range of 0 to 2 dB. If the control signal Ctrl_4 dB is set to an ON state, then $V_{GATE}$ varies the resistance of the variable resistance elements 202 in the first and second series-connected segments 902, which provides an attenuation range of 0 to 4 dB (albeit with a different mapping of $V_{GATE}$ voltage to attenuation level). If the control signals Ctrl_4 dB and Ctrl_8 dB are set to an ON state, then $V_{GATE}$ varies the resistance of the variable resistance elements 202 in the all three series-connected segments 902, which provides an attenuation range of 0 to 8 dB (again, with a different mapping of $V_{GATE}$ voltage to Zo and attenuation level).

The shunt resistance circuit 900 shown in FIG. 9 modifies the number of stacked variable resistance elements 202 per attenuation range state, which may reduce linearity for lower dB ranges as fewer stacked variable resistance elements 202 are controlled by $V_{GATE}$. In applications where linearity requirements may not be met by the shunt resistance circuit 900, an alternative configuration may be used, in which the stack height remains the same regardless of the selected attenuation range. FIG. 10 is a schematic diagram of a second embodiment of a shunt resistance circuit 1000 including multiple variable and selectable resistance elements.

As illustrated, a VVA stack of 1 to n variable resistance elements 202 is controlled by $V_{GATE}$; in one example embodiment, n=12. Series connected to the VVA stack are range setting resistances, including a 2 dB bypassable fixed resistance 1002 controlled by a Ctrl_2 dB control signal, a 4 dB bypassable fixed resistance 1004 controlled by a Ctrl_4 dB control signal, and an 8 dB minimum fixed resistor 1006 (i.e., R8 dB). The Ctrl_2 dB and Ctrl_4 dB control signals operationally enable or disable the corresponding bypassable resistors R2 dB, R4 dB to change the maximum attenuation range of the shunt resistance circuit 1000.

For the illustrated embodiment, each variable resistance element 202 has a maximum resistance in excess of about 100 ohms, the 2 dB bypassable fixed resistance 1002 has a resistance of about 80 ohms, the 4 dB bypassable fixed resistance 1004 has a resistance of about 49.6 ohms, and the 8 dB minimum fixed resistor has a resistance of about 29.8 ohms. As should be clear, the 8 dB minimum fixed resistor could also be implemented as a bypassable fixed resistance, and the values of the various range setting resistances 1002-1006 may be varied from the values disclosed in this example.

In operation, the Ctrl_2 dB and Ctrl_4 dB control signals are normally ON for the 8 dB attenuation range, thus effectively bypassing the associated R2 dB and R4 dB resistances in the path to the minimum fixed resistance R8 dB. For the 4 dB attenuation range, the Ctrl_4 dB control signal is OFF, and the Ctrl_2 dB control signal is ON, thus adding the R4 dB resistance in series with the minimum fixed resistance R8 dB. For the 2 dB attenuation range, both the Ctrl_4 dB and Ctrl_2 dB control signals are OFF, thus adding both of the R2 dB and R4 dB resistances in series with the minimum fixed resistance R8 dB. Attenuation variation within a set range of attenuation is achieved by varying $V_{GATE}$ as a function of $V_{VVA}$.

The shunt resistance circuit 1000 of FIG. 10 maintains the same number of stacked variable resistance elements 202 within the VVA stack for all selectable attenuation ranges and thus assures that the minimum attenuation range will have the best linearity. The shunt resistance circuit 1000 also eliminates the need to switchably couple/decouple the $V_{GATE}$ gate drive within the VVA stack and provides a simple drive interface, since $V_{GATE}$ is applied to a constant number of variable resistance elements 202 compared to the embodiment of FIG. 9.

Variable Series Resistance for VVA Architecture

In a VVA attenuator circuit having series resistance Rser elements (e.g., a T-type attenuator configuration), as noted above, the series resistance Rser element can be varied in order to change the attenuation level of the VVA circuit. Two series resistance circuits are described below that are capable of withstanding high power and high voltages and provide a programmable attenuation range.

FIG. 11 is a schematic diagram of a first embodiment of a series resistance circuit 1100 including multiple variable and selectable resistance elements. In this example, four variable resistance elements 202 are series-connected to form three attenuation segments to provide three selectable attenuation ranges. The variable resistance elements 202 may have equal maximum resistances (e.g., 7.2 maximum ohms). A VVA control voltage $V_{GATE}$, derived from $V_{VVA}$, is connected to the gate of the FET of a first variable resistance element 202, which comprises the first attenuation segment (2 dB in this case). $V_{GATE}$ is switchably connectable to the gates of the FETs of a second variable resistance element 202 (providing an additional 2 dB of attenuation in this case, for a total of 4 dB) through a 4 dB switch 1002 controlled by a Ctrl_4 dB control signal. Similarly, $V_{GATE}$ is switchably connectable to the gates of the FETs of third and fourth variable resistance elements 202 (providing an additional 4 dB of attenuation in this case, for a total of 8 dB) through an 8 dB switch 1004 controlled by a Ctrl_8 dB control signal. The variable resistance elements 202 of the second and third segments are normally biased ON by a +Vg voltage until connected to $V_{GATE}$.

In operation, for a 2 dB attenuation range, the Ctrl_4 dB and Ctrl_8 dB control signals are set to OFF, and hence the variable resistance elements 202 of the second and third segments are biased ON. Accordingly, $V_{GATE}$ modulates only the first 2 dB segment. For a 4 dB attenuation range, the Ctrl_4 dB control signal is set to ON and the Ctrl_8 dB control signal is set to OFF, and hence only the variable resistance elements 202 of the third segment are biased ON. Accordingly, $V_{GATE}$ modulates both the first and second segments (totaling 4 dB of maximum attenuation). For an 8 dB attenuation range, the Ctrl_4 dB and Ctrl_8 dB control signals are set to ON. Accordingly, $V_{GATE}$ modulates the first, second, and third segments (totaling 8 dB of maximum attenuation).

Switchable segments assure that the range for Rser is defined and covered, particularly when the series resistance circuit 1100 is used in conjunction with a variable shunt resistance circuit such as the types shown in FIG. 9 and FIG. 10 (see also FIG. 13 and the accompanying description below).

FIG. 12 is a schematic diagram of a second embodiment of a series resistance circuit 1200 including multiple variable and selectable resistance elements. In this example, four variable resistance elements 202 (e.g., 7.2 maximum ohms each) are series-connected. A VVA control voltage $V_{GATE}$, derived from $V_{VVA}$, is connected to the gates of the corresponding FETs of each variable resistance element 202 and directly modulates the variable resistance elements 202 to achieve a desired level of attenuation.

A simpler circuit than that of FIG. 11, the series resistance circuit 1200 has a fixed architecture that simply has the required range of attenuation when used in an Rser/Rsh attenuator architecture. The amount of range used would depend solely upon the gate voltage to the Rser elements and the gate voltage to the Rsh elements maintaining a constant characteristic impedance Zo (e.g., 50 ohms). This may be done, for example, by means of a suitable control circuit (such as the circuit described below with respect to FIG. 14A), or by trial-and-error determination, or through modeling and/or measurement to determine values that may be stored in and applied from a look-up table.

Example VVA T-Type Attenuator Circuit

The switchable shunt and series resistance circuits shown in FIGS. 9-12 can be combined as desired in a selected attenuator circuit architecture. Indeed, an important aspect of many embodiments of the invention is the design flexibility provided by being able to select and combine switchable series resistance circuits and switchable shunt resistance circuits—the switchable resistance segments will go hand in hand to support meeting a targeted attenuation range.

Figure 13:
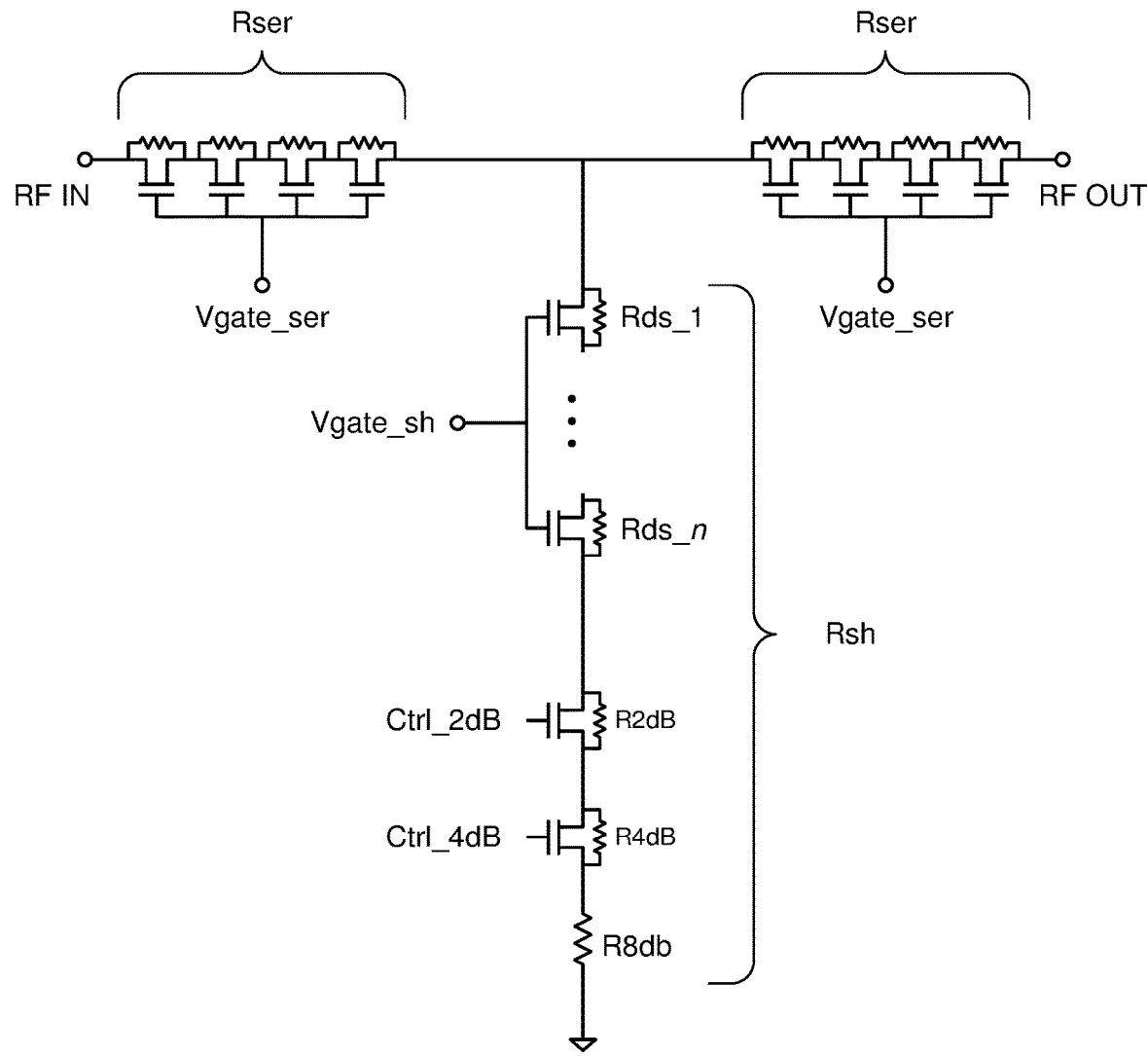
FIG. 13 is a schematic diagram of one embodiment of a variable and selectable VVA configured in a T-type attenuator circuit architecture and using the series resistance circuit of FIG. 12 for Rser and the shunt resistance circuit of FIG. 10 for Rsh.

For example, FIG. 13 is a schematic diagram of one embodiment of a variable and selectable VVA 1300 configured in a T-type attenuator circuit architecture and using the series resistance circuit 1200 of FIG. 12 for Rser and the shunt resistance circuit 1000 of FIG. 10 for Rsh. The Rser series resistance circuits should be sized to support the maximum attenuation range of the VVA 1300 (e.g., 8 dB). By using the simpler series resistance circuit 1200 of FIG. 12, no changes in the stack configuration is required to support a number of distinct attenuation ranges. A control voltage, $V_{gate\_ser}$, derived from the provided $V_{VVA}$ voltage as described above, controls the attenuation value of the Rser series resistance circuits. Preferably, a control loop maintains the attenuation value of Rser as a function of the attenuation value of Rsh. The Rsh shunt resistance circuit should be sized to support the same maximum attenuation range of the VVA 1300 (e.g., 8 dB). A control voltage, $V_{gate\_sh}$, also derived from the provided $V_{VVA}$ voltage described above, controls the Rsh resistance circuit. The R2 dB and R4 dB resistors are selectably switched into or out of circuit based upon a desired attenuation range, as described above with respect to FIG. 10.

As should be clear from the above description, any of the attenuator architectures shown in FIGS. 3-8 can be implemented using the shunt resistance circuits shown in FIGS. 9-10, and any of the attenuator architectures shown in FIGS. 3-6 can be implemented using shunt and series resistance circuits shown in FIGS. 9-12.

Example Control Loop Circuits

A VVA in accordance with the present teachings generally requires a control loop to maintain a desired setting. For the VVA 1300 embodiment shown in FIG. 13, it may be desirable to utilize two distinct control loops to control the operational behavior of the VVA: a first control loop for attenuation setting (for example, for gain control, power level adjustment, and/or temperature compensation) under the control of a total system control loop (generally external to the VVA), and a second control loop for controlling the characteristic impedance of the VVA across the attenuation range of the VVA (preferably established by an internal VVA control loop). Optionally, the second control loop may be used to selectively adjust the VVA to operate with different characteristic impedances, such as 50 ohms or 75 ohms.

Figure 14A:
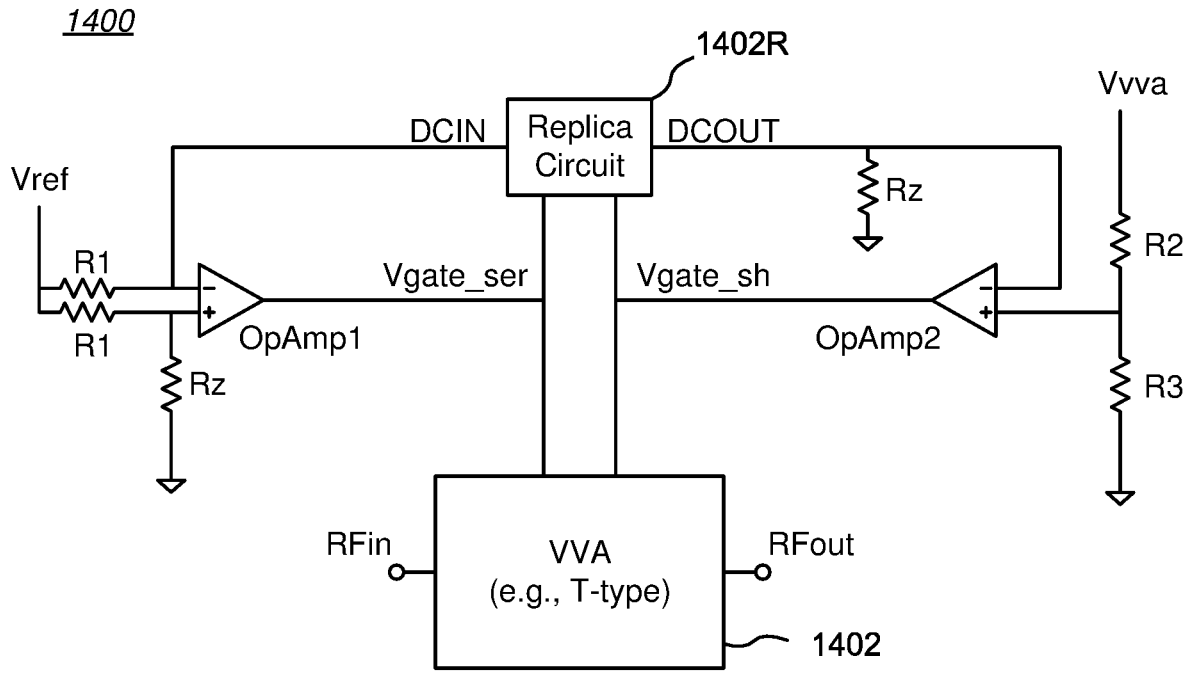
FIG. 14A is a schematic diagram of an impedance control loop for a T-type variable and selectable VVA circuit.

FIG. 14A is a schematic diagram of an impedance control loop 1400 for a T-type variable and selectable VVA circuit. In essence, an impedance mirror controls the impedance level of the series and shunt resistance devices of a VVA 1402 so that a desired characteristic impedance Zo is maintained. In a novel configuration, if the VVA 1402 has a T-type architecture as shown in FIG. 13, a replica circuit 1402R may be provided which is a scaled replica (e.g., same T-type architecture but ⅛ size) of the VVA 1402. Accordingly, both the VVA 1402 and the scaled replica circuit 1402R include Rser and Rsh resistance circuits, and thus the scaled replica circuit 1402R essentially faithfully mimics (in a scaled manner) the characteristics and performance behavior of the actual VVA 1402.

In the illustrated example, the replica circuit 1402R is coupled to an input voltage DCIN and provides an attenuated voltage DCOUT. The attenuation levels of the VVA 1402 and the replica circuit 1402R are controlled by a series resistance gate voltage Vgate_ser and a shunt resistance voltage Vgate_sh. The reference voltage Vref is also coupled through paired resistors R1 (e.g., 400 ohms each) to the negative and positive inputs of a first operational amplifier OpAmp1.

As illustrated, the positive input of OpAmp1 is also coupled through an impedance setting shunt resistor Rz. Accordingly, the positive input of OpAmp1 is coupled to a resistive divider comprising one of the R1 resistors and the Rz shunt resistor, while the negative input of OpAmp1 provides a constant DCIN voltage. The output of OpAmp1 is Vgate_ser, which is coupled to the FET gates within the Rser resistance circuits in the VVA 1402 and the replica circuit 1402R.

An attenuation level control voltage $V_{VVA}$ from a source external to the illustrated circuitry (see FIG. 1 as an example) is applied to a resistive divider formed by resistors R1 (e.g., 100K ohms) and R3 (e.g., 10K ohms). The divided voltage between R2 and R3 is coupled to the positive input of a second operational amplifier OpAmp2. The negative input of OpAmp2 is coupled to DCOUT and an impedance setting shunt resistor Rz. The output of OpAmp2 is Vgate_sh, which is coupled to the FET gates of the Rsh resistance circuits within the VVA 1402 and the replica circuit 1402R.

Note that, as a practical matter, Rz may be implemented as a set of multiple resistor elements. For example, for a characteristic impedance Zo of 50 ohms, Rz may equal 400 ohms, which may be fabricated as 8 resistors of 50 ohms each (i.e., 8×50Ω). This approach helps maintain a known relationship with the targeted RF Zo level by keeping OpAmp1 in a good design region and related currents to comparatively small levels, while minimizing processing variations that can impact the actual value of either very small or very large valued resistors.

In operation, as the attenuation level control voltage $V_{VVA}$ changes, OpAmp1 adjusts Vgate_ser to the FET gates of the Rser series resistances within the VVA 1402 and the replica circuit 1402R to maintain a DC input impedance equal to the characteristic impedance Zo (e.g., 50 ohms, set by the value of Rz) by equalizing the voltages applied to the positive and negative inputs of OpAmp1. By maintaining a linear relationship between the attenuation level control voltage $V_{VVA}$ and the DCOUT voltage, the Vgate_sh output of OpAmp2 varies the attenuation of the VVA 1402 and the replica circuit 1402R by changing the value of their corresponding Rsh shunt resistances.

The impedance control loop 1400 can be adapted to selectively adjust the VVA 1402 to operate with different characteristic impedances, such as 50 ohms or 75 ohms. One alternative configuration is to provide two different impedance setting shunt resistors Rz (e.g., 400 ohms for a 50-ohm characteristic impedance, and 600 ohms for a 75-ohm characteristic impedance) with a selectable connection to couple one or the other resistance value into the circuit. Such an adjustment may be a one-time selection made during IC fabrication (e.g., by wire-bonding or mask-level connections) or selectable after IC fabrication (e.g., by providing a single-pole double-throw switch to selectively connect one or the other resistance value into the circuit under program control or by a pin-level control voltage).

Figure 14B:
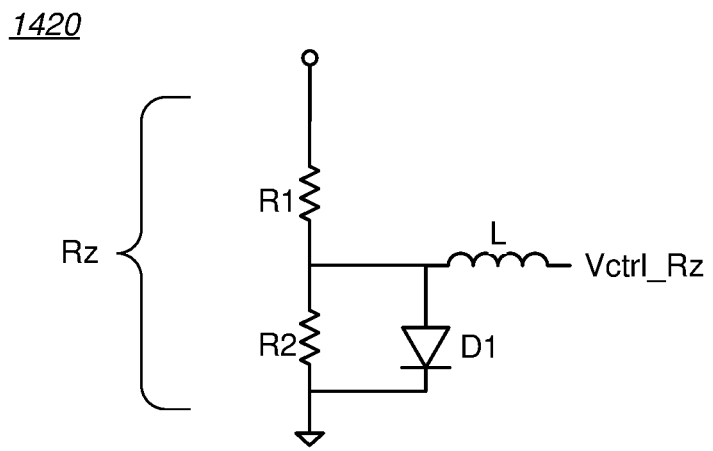
FIG. 14B is a schematic diagram of a variable impedance circuit suitable for use in conjunction with the circuit of FIG. 14B as the impedance setting shunt resistors Rz.

In a variation of this configuration, Rz may be a variable resistance element under program or other control. In other embodiments, Rz may be a combination of fixed and variable resistance elements (which may be passive and/or active, including transistors and/or diodes) that provide a programmable variable resistance. For example, FIG. 14B is a schematic diagram of a variable impedance circuit 1420 suitable for use in conjunction with the circuit of FIG. 14B as the impedance setting shunt resistors Rz. A junction point between series-connected resistors R1 and R2 is coupled through an inductor to a control voltage Vctrl_Rz. A diode D1 is coupled in parallel around R2. In this example, if Vctrl_Rz=0V, then the circuit behaves as if D1 was disconnected, and the total resistance of Rz is R1+R2; however, if Vctrl_Rz=~2V, then D1 behaves as a resistor with resistance $R_D$, and the total resistance of Rz is R1+(R2||$R_D$).

Figure 15:
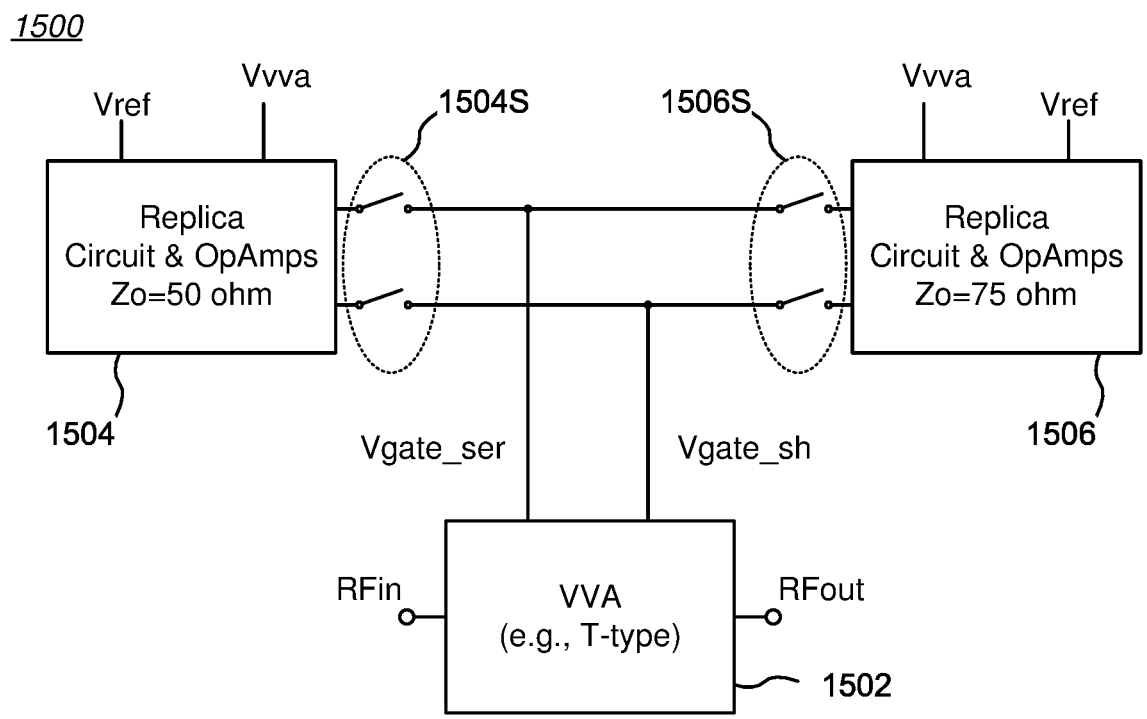
FIG. 15 is a block diagram of an alternative control loop configuration for selectively adjusting a VVA to operate with different characteristic impedances.

FIG. 15 is a block diagram of an alternative control loop configuration 1500 for selectively adjusting a VVA 1502 to operate with different characteristic impedances. In this embodiment, the Vgate_ser and Vgate_sh output voltages of two complete sets 1504, 1506 of replica circuits and associated operational amplifiers of the type shown in FIG. 14A are selectably connectable to the VVA 1502 through corresponding sets of switches 1504S, 1506S. As indicated, one replica circuit/OpAmp set 1504 is configured internally (e.g., by setting Rz) to match a characteristic impedance Zo of 50 ohms, while the other one replica circuit/OpAmp set 1506 is configured internally (again, for example, by setting Rz) to match a characteristic impedance Zo of 75 ohms.

As an example of how Rser and Rsh within a T-type VVA of the type shown in FIG. 13 may be set to achieve different levels of attenuation at different characteristic impedances Zo, TABLE 1 sets forth a set of example values for characteristic impedances of 50 ohms and 75 ohms. As described above, for a desired attenuation (loss) level $A_{dB}$ (expressed as a negative dB value), a value $A_{MAG}$ can be defined as:

$$A_{MAG} = 10^{(A_{dB}/20)}$$

and Rser and Rsh can be defined in terms of $A_{MAG}$ and the system characteristic impedance Zo as:

$$R_{SER} = Z_O \frac{1 - A_{MAG}}{1 + A_{MAG}}$$

$$R_{SH} = \frac{2 * Z_O * A_{MAG}}{1 - 10^{(A_{dB}/10)}}$$

TABLE 1

| A(dB) | $A_{MAG}$ | $Z_0 = 50\Omega$ Rser (ohms) | $Z_0 = 50\Omega$ Rsh (ohms) | $Z_0 = 75\Omega$ Rser (ohms) | $Z_0 = 75\Omega$ Rsh (ohms) |
|---|---|---|---|---|---|
| −2 | 0.794 | 5.73 | 215.2 | 8.60 | 322.9 |
| −4 | 0.631 | 11.3 | 104.8 | 17.0 | 157.2 |
| −8 | 0.398 | 21.5 | 47.3 | 32.3 | 71.0 |

Having a single part that addresses all of these different requirements is also challenging. This invention addresses the fundamental architecture needed to cover multiple VVA attenuation ranges and the means for providing both a digital and an analog interface to control the VVA. In particular, embodiments of the invention can provide a variety of ranges (2 dB to 30 dB are common).

Methods

Figure 16:
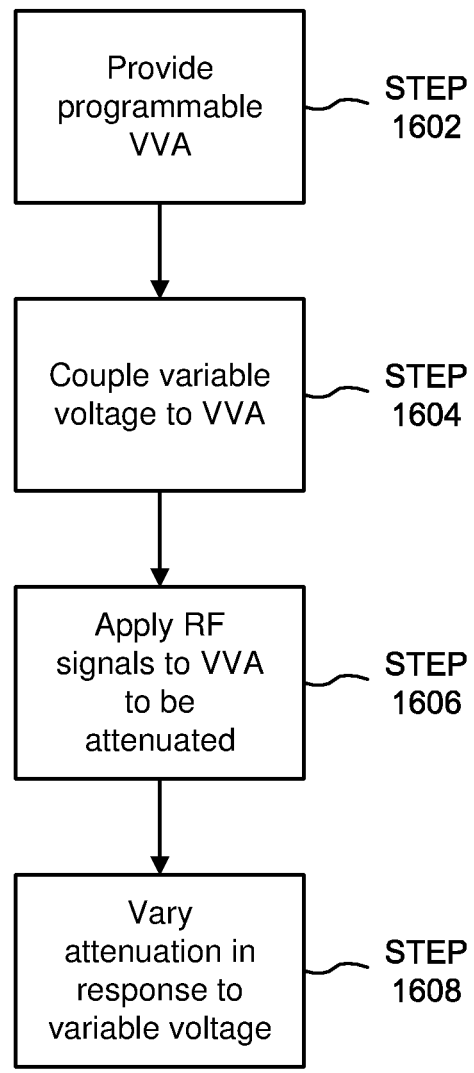
FIG. 16 is a flow-chart depicting a first method for continuously varying the attenuation of applied radio frequency signals under program control.

Another aspect of the invention includes a method for continuously varying the attenuation of applied radio frequency signals under program control. For example, FIG. 16 is a flow-chart 1600 depicting a first method for continuously varying the attenuation of applied radio frequency signals under program control. The method flow-chart 1600 includes: providing a programmable voltage variable attenuator having at least one voltage controlled variable resistance shunt element responsive to an applied shunt control voltage (STEP 1602); coupling a variable voltage to the at least one voltage controlled variable resistance shunt element as the applied shunt control voltage (STEP 1604);

applying radio frequency signals to the programmable voltage variable attenuator (STEP 1606); and varying the attenuation of the applied radio frequency signals in response to the applied shunt control voltage (STEP 1604). As should be clear, the order of at least steps 1604 and 1606 may be reversed.

Yet another aspect of the invention includes a method for continuously varying the attenuation of applied radio frequency signals under program control, including: providing a first voltage controlled variable resistance series element; configuring the first voltage controlled variable resistance series element to be coupled to an applied series variable voltage derived from the applied control voltage; configuring the first voltage controlled variable resistance series element to receive an applied radio frequency signal; connecting a second voltage controlled variable resistance series element in series with the first voltage controlled variable resistance series element; configuring the second voltage controlled variable resistance series element to be coupled to the applied series variable voltage and to output an attenuated radio frequency signal; connecting a voltage controlled variable resistance shunt element between the first and second voltage controlled variable resistance series elements and circuit ground; configuring the voltage controlled variable resistance shunt element to be coupled to an applied shunt variable voltage derived from the applied control voltage; and continuously varying the attenuation of the applied radio frequency signal in response to the applied control voltage.

Figure 17:
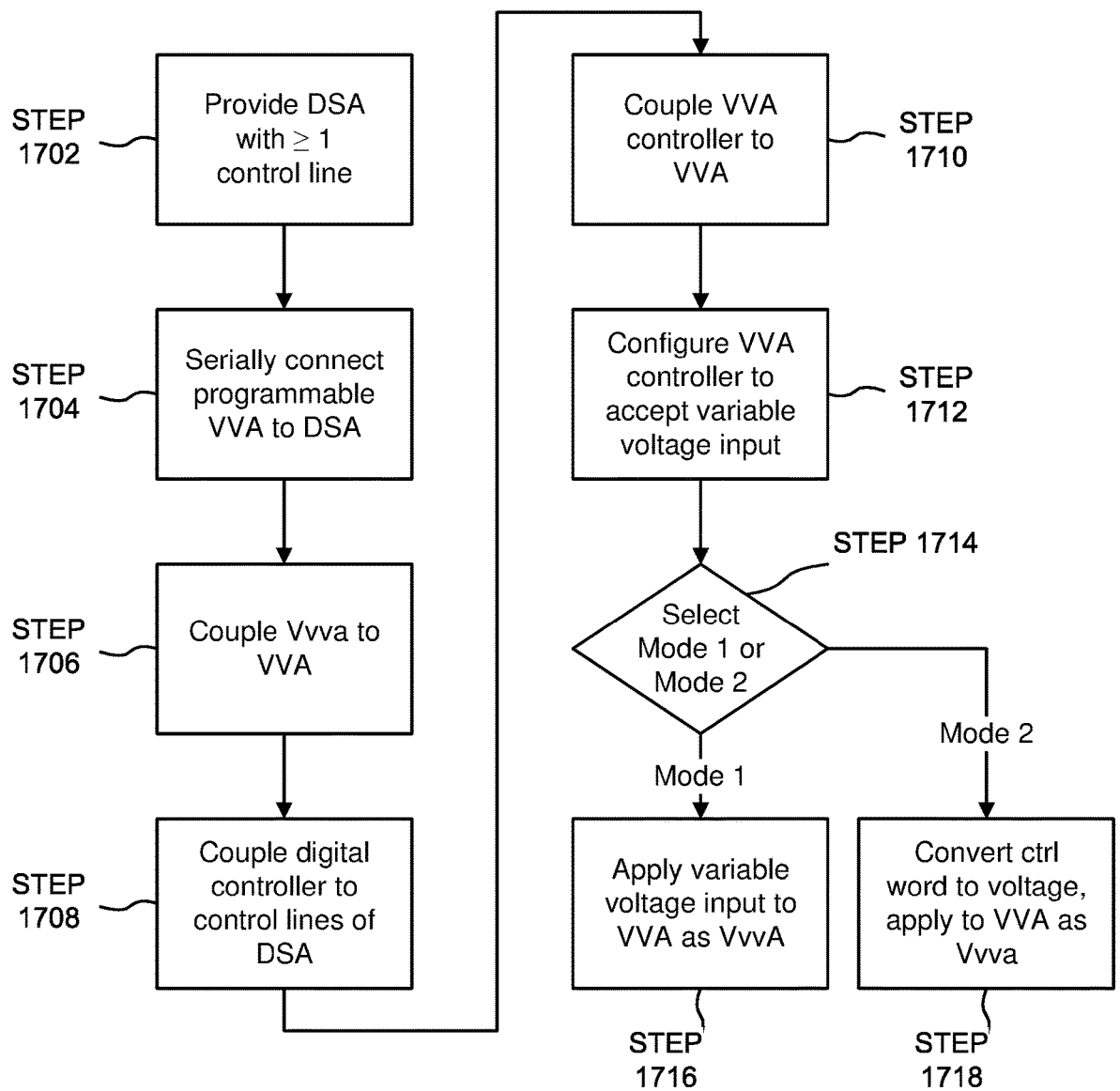
FIG. 17 is a flow-chart depicting a second method for continuously varying the attenuation of applied radio frequency signals under program control.

Still another aspect of the invention includes a method for continuously varying the attenuation of applied radio frequency signals under program control within a step range of attenuation set under program control. For example, FIG. 17 is a flow-chart 1700 depicting a second method for continuously varying the attenuation of applied radio frequency signals under program control. The method of flow-chart 1700 includes: providing a digital step attenuator (DSA) coupled to at least one control line (STEP 1702); connecting a programmable voltage variable attenuator (VVA) in series with the DSA (STEP 1704); coupling a first variable voltage Vvva to the programmable VVA for selecting a continuous level of attenuation for the applied radio frequency signals (STEP 1706); coupling a digital controller to the DSA through the at least one control line, for programmatically selecting a stepped attenuation level for the applied radio frequency signal (STEP 1708); coupling a VVA controller to the programmable VVA (STEP 1710); configuring the VVA controller to be coupled to a second variable voltage (STEP 1712); and selecting a mode of operation for the programmable VVA (STEP 1714), the first mode of operation including applying the second variable voltage to the programmable VVA as the first variable voltage (STEP 1716), and the second mode of operation including receiving an applied control word, converting the applied control word to a third variable voltage, and applying the third variable voltage to the programmable VVA as the first variable voltage (STEP 1718). As should be clear, the order of many of the steps may be rearranged without affecting the outcome of the method, and a number of the steps may be performed in parallel.

Other aspects of the above method include one or more of the following: operatively coupling at least one variable resistance series element to the at least one voltage controlled variable resistance shunt element, the at least one variable resistance series element being responsive to an applied series control voltage, and varying the attenuation of the applied radio frequency signals in response to the applied series control voltage; at least one variable resistance series element having at least one stack of series-coupled field effect transistors controlled by the applied series control voltage; at least one variable resistance series element having a plurality of series-coupled field effect transistors (FETs), and further including coupling at least a subset of the plurality of FETs to a corresponding control switch, and selectively controlling application of the applied series control voltage to such subset of FETs to thereby control the attenuation range of the programmable voltage variable attenuator; configuring the programmable voltage variable attenuator with a T-type attenuator architecture, a Pi-type attenuator architecture, a bridged-T type attenuator architecture, an L-pad type attenuator architecture, a reflection type attenuator architecture, or a balanced coupler type attenuator architecture; at least one variable resistance shunt element has at least one stack of series-coupled field effect transistors; coupling at least one bypassable resistance in series with the at least one variable resistance shunt element, coupling each bypassable resistance to a control signal, and applying the control signal to selectively operationally enable or disable each bypassable resistance to thereby control the attenuation range of the programmable voltage variable attenuator.

Still other aspects of the above method include one or more of the following: at least one variable resistance shunt element having a plurality of serially-coupled stacks of series coupled FETs, and further including selectively controlling at least some of the plurality of serially coupled stacks of series coupled FETs to be operationally enabled or disabled to thereby control the attenuation range of the programmable voltage variable attenuator; coupling an impedance control loop circuit to the programmable voltage variable attenuator, applying a control voltage to the impedance control loop circuit, and maintaining a selected attenuation level as a function of the applied control voltage; adapting the impedance control loop circuit to at least two different characteristic impedances; the impedance control loop circuit having at least one impedance setting resistor Rz, and further including adapting the impedance control loop circuit to at least two different characteristic impedances by setting corresponding values for the at least one impedance setting resistor Rz; selectably connecting one of at least two impedance control loop circuits to the programmable voltage variable attenuator, each impedance control loop corresponding to a different characteristic impedance, and maintaining a selected corresponding attenuation level as a function of the applied control voltage for a corresponding different characteristic impedance; the programmable voltage variable attenuator having at least one voltage controlled variable resistance shunt element responsive to the applied first variable voltage for varying the attenuation of the applied radio frequency signals; operatively coupling at least one variable resistance series element to the at least one voltage controlled variable resistance shunt element, the at least one variable resistance series element being responsive to the applied first variable voltage, and varying the attenuation of the applied radio frequency signals in response to the applied first variable voltage; the programmable voltage variable attenuator having a first voltage controlled variable resistance series element, configured be coupled to a series variable voltage derived from the applied first variable voltage and configured to receive an applied radio frequency signal, a second voltage controlled variable resistance series element, series-connected to the first voltage controlled variable resistance series element and configured be coupled to the series variable voltage, for outputting an attenuated radio frequency signal and a voltage controlled variable resistance shunt element series-connected between the first and second voltage controlled variable resistance series elements and circuit ground, and configured to be coupled to a shunt variable voltage derived from the applied first variable voltage, for varying the attenuation of the applied radio frequency signal.

Fabrication Technologies and Options

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 1 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A method for continuously varying the attenuation of applied radio frequency signals under program control, including:
   (a) providing a programmable voltage variable attenuator including:
      (1) at least one voltage controlled variable resistance shunt element, each voltage controlled variable resistance shunt element responsive to a corresponding applied shunt control voltage; and
      (2) at least one bypassable resistance coupled in series with the at least one variable resistance shunt element, each bypassable resistance responsive to a corresponding control signal;
   (b) applying radio frequency signals to the programmable voltage variable attenuator;
   (c) applying one or more shunt control voltages to corresponding ones of the at least one voltage controlled variable resistance shunt element to vary the attenuation of the applied radio frequency signals; and
   (d) applying one or more control signals to corresponding ones of the at least one bypassable resistance to selectively enable or disable the corresponding bypassable resistance to control the attenuation range of the programmable voltage variable attenuator.

2. The method of claim 1, further including:
   (a) coupling at least one variable resistance series element to the at least one voltage controlled variable resistance shunt element, each variable resistance series element responsive to a corresponding applied series control voltage; and
   (b) applying one or more series control voltages to corresponding ones of the at least one variable resistance series element to vary the attenuation of the applied radio frequency signals.

3. The method of claim 2, wherein at least one variable resistance series element includes at least one stack of series-coupled field effect transistors controlled by the applied series control voltage.

4. The method of claim 1, wherein at least one variable resistance shunt element includes at least one stack of series-coupled field effect transistors.

5. The method of claim 1, wherein at least one variable resistance shunt element includes a plurality of serially-coupled stacks of series coupled FETs, and further including selectively controlling at least some of the plurality of serially coupled stacks of series coupled FETs to be enabled or disabled to control the attenuation range of the programmable voltage variable attenuator.

6. The method of claim 1, further including:
   (a) coupling an impedance control loop circuit to the programmable voltage variable attenuator;
   (b) applying a control voltage to the impedance control loop circuit; and (c) maintaining a selected attenuation level as a function of the applied control voltage.

7. The method of claim 1, further including:
(a) selectably coupling one of at least two impedance control loop circuits to the programmable voltage variable attenuator, each impedance control loop corresponding to a different characteristic impedance; and
(b) maintaining a selected corresponding attenuation level as a function of the applied control voltage for a corresponding different characteristic impedance.

8. A method for continuously varying the attenuation of applied radio frequency signals under program control, including:
(a) providing a programmable voltage variable attenuator including:
  (1) at least one voltage controlled variable resistance shunt element, each voltage controlled variable resistance shunt element responsive to a corresponding shunt control voltage; and
  (2) at least one variable resistance series element coupled to the at least one voltage controlled variable resistance shunt element, each variable resistance series element responsive to a corresponding series control voltage, wherein at least one variable resistance series element includes a plurality of series-coupled field effect transistors (FETs);
(b) coupling at least a subset of the plurality of FETs to a corresponding control switch;
(c) applying radio frequency signals to the programmable voltage variable attenuator;
(d) applying one or more shunt control voltages to corresponding ones of the at least one voltage controlled variable resistance shunt element to vary the attenuation of the applied radio frequency signals;
(e) applying one or more series control voltages to corresponding ones of the at least one variable resistance series element to vary the attenuation of the applied radio frequency signals; and
(f) selectively controlling application of the series control voltage to the at least one subset of FETs through the corresponding control switch to control the attenuation range of the programmable voltage variable attenuator.

9. A method for continuously varying the attenuation of applied radio frequency signals under program control, including:
(a) providing a programmable voltage variable attenuator including:
  (1) a first voltage controlled variable resistance series element;
  (2) a second voltage controlled variable resistance series element coupled in series with the first voltage controlled variable resistance series element;
  (3) a voltage controlled variable resistance shunt element coupled between the first and second voltage controlled variable resistance series elements; and
  (4) at least one bypassable resistance coupled in series between the voltage controlled variable resistance shunt element and circuit ground;
(b) configuring the first voltage controlled variable resistance series element to receive an applied radio frequency signal and to be coupled to an applied series variable voltage derived from an applied control voltage;
(c) configuring the second voltage controlled variable resistance series element to be coupled to the applied series variable voltage and to output an attenuated radio frequency signal;
(d) configuring the voltage controlled variable resistance shunt element to be coupled to an applied shunt variable voltage derived from the applied control voltage;
(e) configuring each bypassable resistance to be coupled to a corresponding range control signal;
(f) applying the range control signals to corresponding ones of the at least one bypassable resistance to selectively enable or disable the corresponding bypassable resistance to control an attenuation range for the programmable voltage variable attenuator; and
(g) continuously varying the attenuation of the applied radio frequency signal in response to the applied control voltage.

10. The method of claim 9, wherein the voltage controlled variable resistance shunt element includes at least one stack of series-coupled field effect transistors.

11. The method of claim 9, further including:
(a) coupling an impedance control loop circuit to the programmable voltage variable attenuator;
(b) applying a control voltage to the impedance control loop circuit; and
(c) maintaining a selected attenuation level as a function of the applied control voltage.

12. The method of claim 9, further including:
(a) selectably coupling one of at least two impedance control loop circuits to the programmable voltage variable attenuator, each impedance control loop corresponding to a different characteristic impedance; and
(b) maintaining a selected corresponding attenuation level as a function of the applied control voltage for a corresponding different characteristic impedance.

\* \* \* \* \*